(12) United States Patent
Sugimori et al.

(10) Patent No.: US 11,380,724 B2
(45) Date of Patent: Jul. 5, 2022

(54) LIGHT RECEPTION ELEMENT AND METHOD FOR MANUFACTURING LIGHT-RECEPTION ELEMENT

(71) Applicant: HAMAMATSU PHOTONICS K.K., Hamamatsu (JP)

(72) Inventors: Ryo Sugimori, Hamamatsu (JP); Yuma Tanaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/042,509

(22) PCT Filed: Apr. 9, 2019

(86) PCT No.: PCT/JP2019/015499
§ 371 (c)(1),
(2) Date: Sep. 28, 2020

(87) PCT Pub. No.: WO2019/203070
PCT Pub. Date: Oct. 24, 2019

(65) Prior Publication Data
US 2021/0020678 A1   Jan. 21, 2021

(30) Foreign Application Priority Data

Apr. 18, 2018 (JP) .............................. JP2018-080000

(51) Int. Cl.
*H01L 27/146* (2006.01)

(52) U.S. Cl.
CPC .. *H01L 27/14623* (2013.01); *H01L 27/14618* (2013.01); *H01L 27/14625* (2013.01); *H01L 27/14685* (2013.01)

(58) Field of Classification Search
CPC .................... H01L 27/14623; H01L 27/14618
See application file for complete search history.

(56) References Cited

U.S. PATENT DOCUMENTS 4,315,159 A * 2/1982 Niwa .................... G01J 1/42
250/201.2
9,608,023 B1 3/2017 Miao et al.
(Continued)

FOREIGN PATENT DOCUMENTS

EP 1471333 A1 10/2004
JP H04-084462 A 3/1992
(Continued)

OTHER PUBLICATIONS

International Preliminary Report on Patentability dated Oct. 29, 2020 for PCT/JP2019/015499.

*Primary Examiner* — Thanh Luu
(74) *Attorney, Agent, or Firm* — Faegre Drinker Biddle & Reath LLP

(57) ABSTRACT

A light reception element includes a semiconductor portion having a first surface including a light receiving portion and a light shielding portion, and a light shielding metal film provided on the light shielding portion. The metal film has a second surface facing a side opposite to the first surface and receiving incident light. A plurality of recess portions are formed on the second surface. An inner surface of the recess portion includes a curved portion curved such that the recess portion reduces in size in a direction along the second surface from the second surface toward a bottom part of the recess portion.

6 Claims, 16 Drawing Sheets

(56) References Cited

U.S. PATENT DOCUMENTS

2003/0039925 A1 2/2003 Jang et al.
2015/0293271 A1* 10/2015 Miyasaka ............ G02B 5/0278
                                                          353/38

FOREIGN PATENT DOCUMENTS

| JP | H05-175539 A | 7/1993 |
| JP | 2774006 B2 | 7/1998 |
| JP | 2014-241351 A | 12/2014 |
| JP | 2015-079232 A | 4/2015 |
| WO | WO-2013/061990 A1 | 5/2013 |

* cited by examiner

Fig.4
(a) 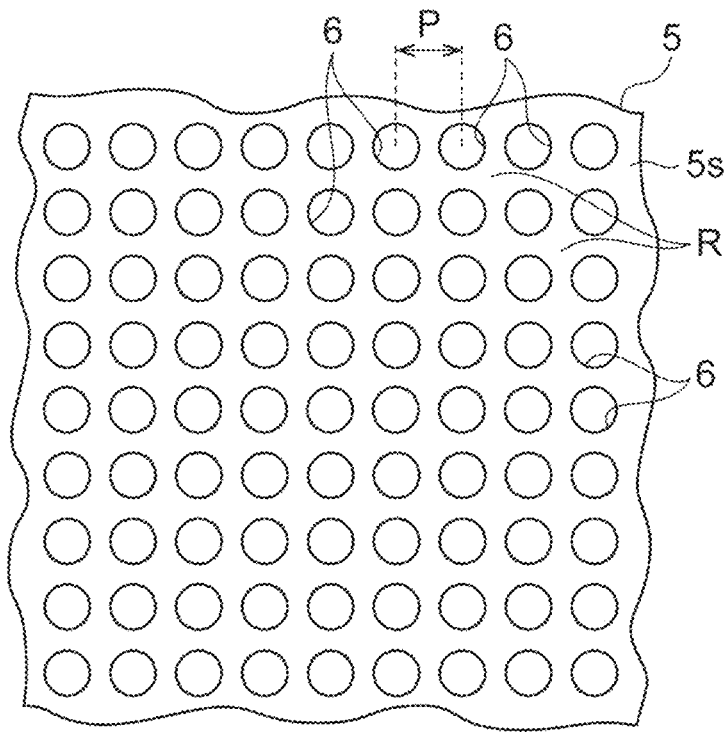
(b) 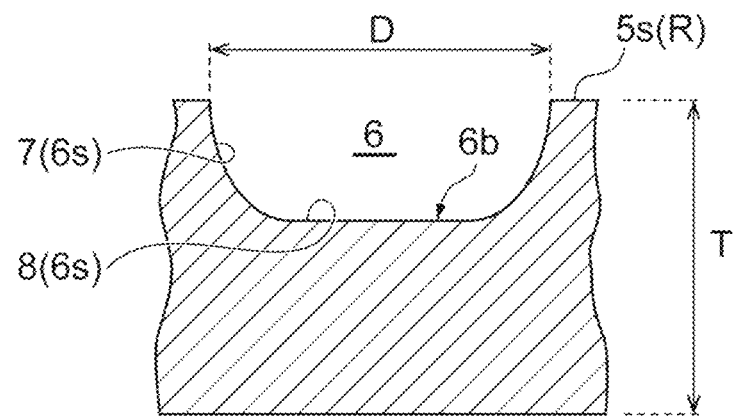
(c) 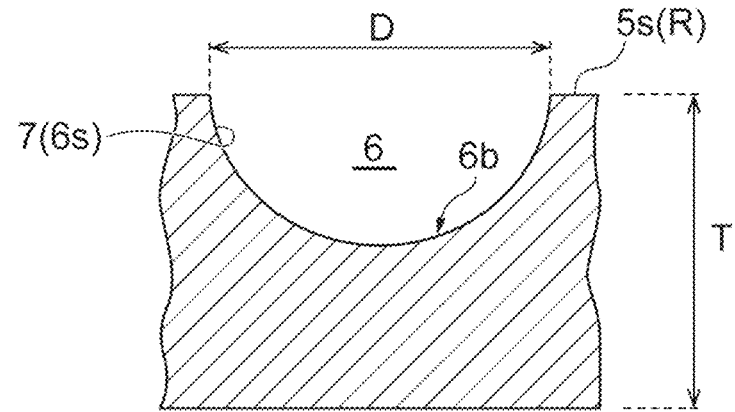

Fig.11
(a)
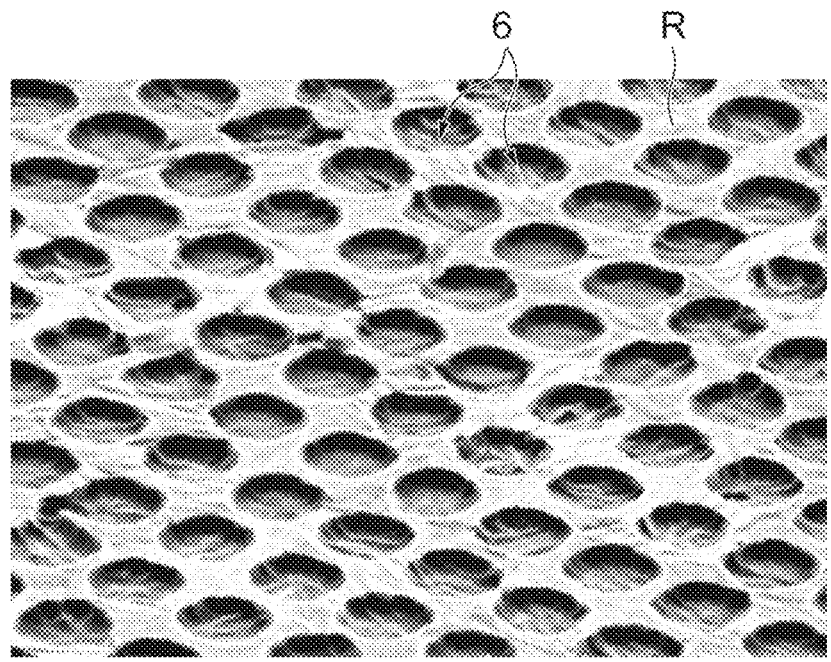
(b)
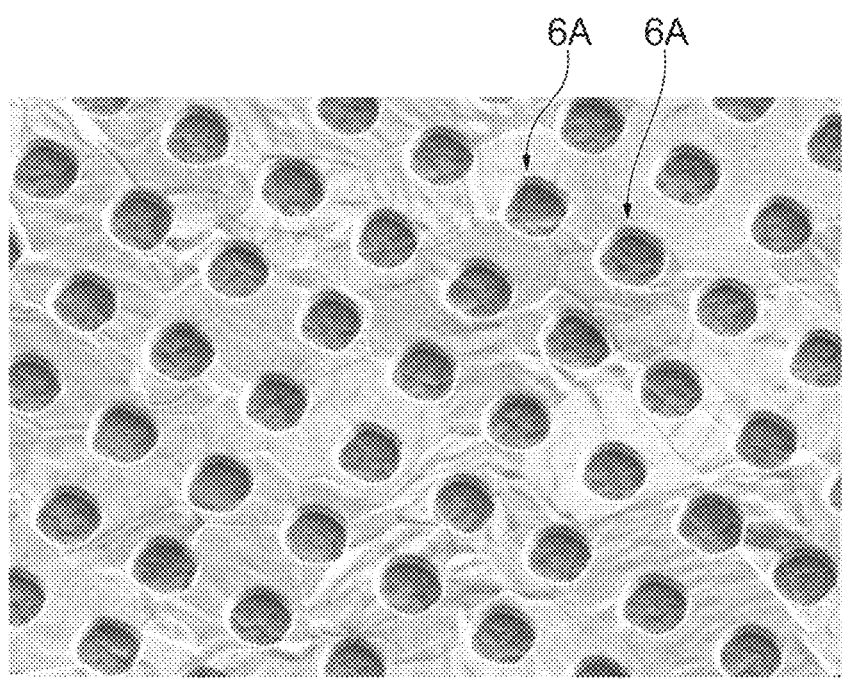

*Fig.14*
(a)
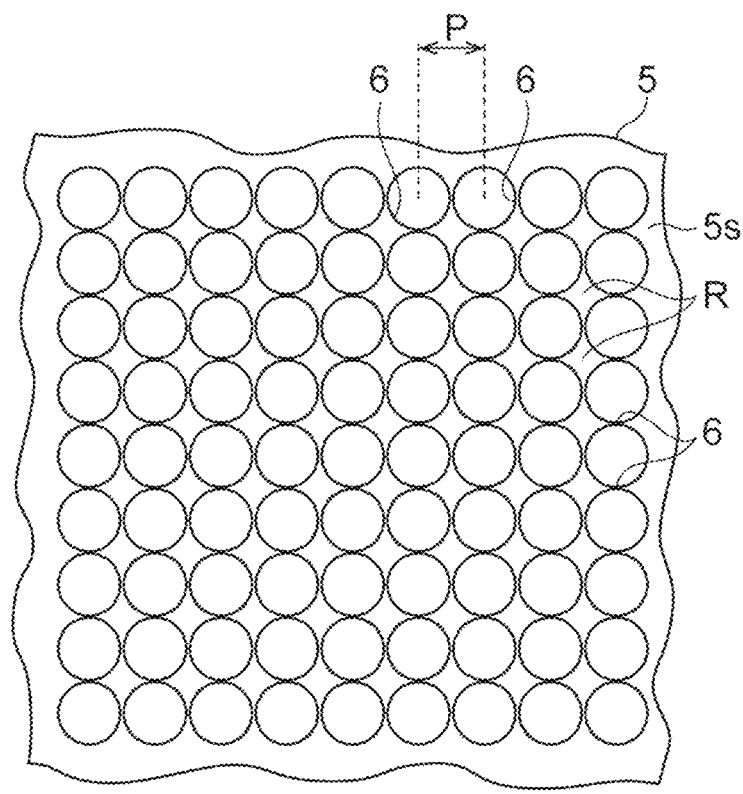
(b)
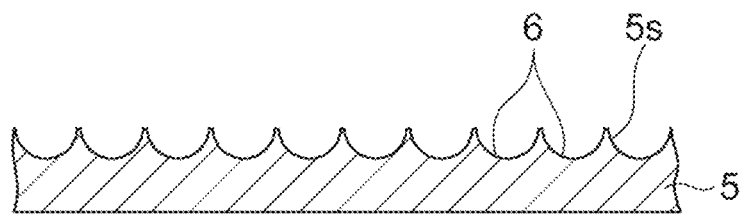

Fig.16
(a)
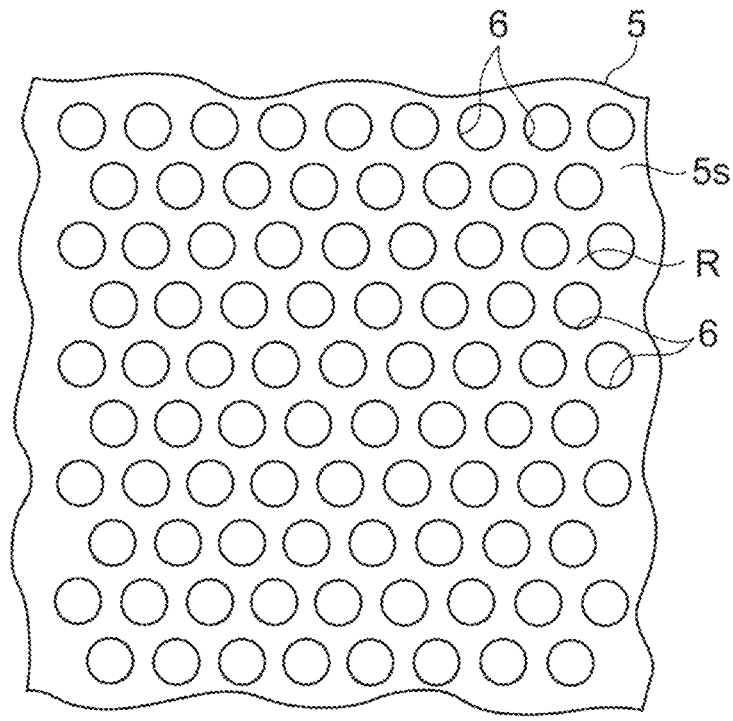
(b)
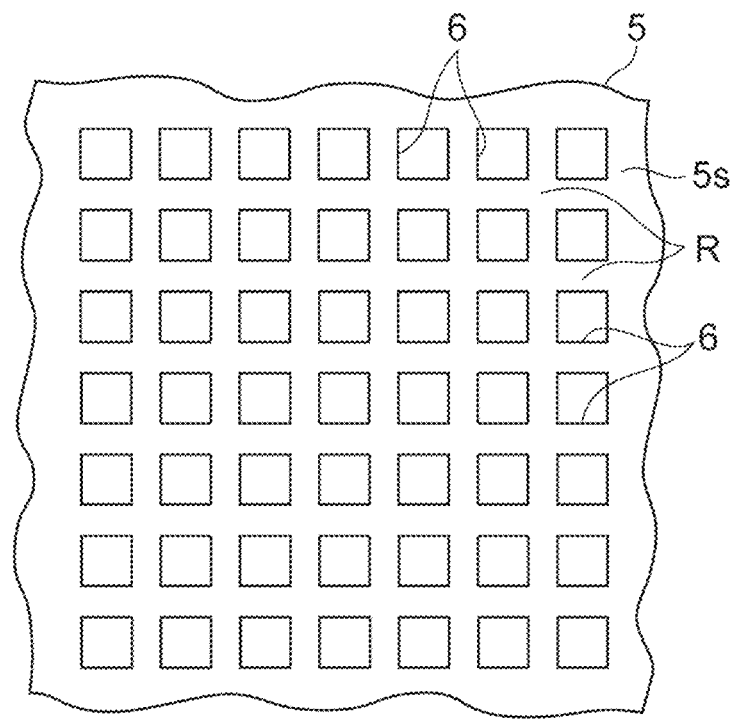

LIGHT RECEPTION ELEMENT AND METHOD FOR MANUFACTURING LIGHT-RECEPTION ELEMENT

TECHNICAL FIELD

An aspect of the present invention relates to a light reception element and a method for manufacturing a light reception element.

BACKGROUND ART

Patent Literature 1 discloses a photoconductive infrared detector. In this detector, a light shielding mask is provided with respect to a crystal absorbing infrared rays. The light shielding mask is provided with openings providing light receiving portions. In addition, periodical unevenness is formed in the light shielding mask. Further, parameters related to an interval and steps of the unevenness are set to satisfy interference conditions for weakening of infrared rays directly returning to an optical system of an image capturing device from the light shielding mask.

Patent Literature 2 discloses a semiconductor light receiving device. This light receiving device includes an n-type InP substrate, an n-type InP layer formed on the n-type InP substrate, a p-type InP layer formed on the n-type InP layer, a dielectric film formed on the p-type InP layer in a manner of opening in a part of the p-type InP layer, and a metal layer for a light shielding mask formed on the dielectric film and performing light shielding of light incident on a part other than the light receiving portion. Unevenness is formed on a front surface of the metal layer.

CITATION LIST

Patent Literature

[Patent Literature 1] Japanese Unexamined Patent Publication No. H4-84462
[Patent Literature 2] Japanese Patent No. 2774006

SUMMARY OF INVENTION

Technical Problem

The detector disclosed in Patent Literature 1 aims to eliminate blurring of an infrared image by setting the parameters for periodical unevenness of the light shielding mask such that the interference conditions for weakening of return light are satisfied. In addition, the light receiving device disclosed in Patent Literature 2 aims to prevent noise of return light by forming unevenness on the front surface of the metal layer for a light shielding mask to achieve diffused reflection of incident light. In this manner, in the foregoing technical field, it is desired to reduce the reflectance in a light shielding portion.

An object of an aspect of the present invention is to provide a light reception element and a method for manufacturing a light reception element capable of reducing a reflectance in a light shielding portion.

Solution to Problem

According to an aspect of the present invention, there is provided a light reception element including a semiconductor portion having a first surface including a light receiving portion and a light shielding portion, and a light shielding metal film provided on the light shielding portion. The metal film has a second surface facing a side opposite to the first surface and receiving incident light. A plurality of recess portions are formed on the second surface. An inner surface of the recess portion includes a curved portion curved such that the recess portion reduces in size in a direction along the second surface from the second surface toward a bottom part of the recess portion.

In this light reception element, the light shielding metal film is formed on the light shielding portion on the first surface of the semiconductor portion. The metal film has the second surface facing a side opposite to the first surface. The plurality of recess portions are formed on the second surface. Further, the inner surface of the recess portion includes the curved portion curved such that the recess portion reduces in size from the second surface of the metal film toward the bottom part of the recess portion. For this reason, a part of light incident on the second surface of the metal film is reflected and diffused in various directions due to the curved portions on the inner surfaces of the recess portions. As a result, a reflectance in the light shielding portion is reduced.

In the light reception element according to the aspect of the present invention, the curved portion may extend so as to form the bottom part. In this case, since the entireties of the inner surfaces of the recess portions become the curved portions, incident light can be reliably diffused.

In the light reception element according to the aspect of the present invention, a size of the recess portion on the second surface may be equal to or smaller than a size of the metal film in a direction intersecting the second surface. In this case, even if the curved portion is formed to have a semispherical surface shape having a diameter equivalent to the size of the recess portion on the second surface, light shielding properties can be sufficiently maintained due to the metal film remaining immediately below the bottom part of the recess portion.

In the light reception element according to the aspect of the present invention, the second surface may include a flat region provided around the recess portions. In this case, the reflectance can be reliably reduced due to interference between light reflected by the flat region on the second surface and light reflected by the inner surfaces of the recess portions.

In the light reception element according to the aspect of the present invention, the recess portions may be arranged at a constant pitch along the second surface. In this case, formation of the recess portions can be facilitated.

Here, according to another aspect of the present invention, there is provided a method for manufacturing a light reception element including a first step of forming a metal film for light shielding on a part of a first surface of a semiconductor portion to a light receiving portion exposed from the metal film and a light shielding portion covered with the metal film on a first surface, and a second step of performing isotropic etching on a second surface of the metal film facing side opposite to the first surface to form a plurality of recess portions on a second surface by performing isotropic etching on the second surface of the metal film facing a side opposite to the first surface.

According to this manufacturing method, a light reception element including the semiconductor portion having the first surface including the light receiving portion and the light shielding portion, and the metal film provided on the light shielding portion and having a plurality of recess portions formed therein is manufactured. Particularly, through isotropic etching on the second surface of the metal film, an inner surface of the recess portion can be formed to include a curved portion curved such that the recess portion reduces in size from the second surface of the metal film toward a bottom part of the recess portion. Therefore, according to this manufacturing method, it is possible to manufacture a light reception element in which the reflectance in the light shielding portion is reduced.

In the method for manufacturing a light reception element according to the aspect of the present invention, the isotropic etching may be wet etching. In this case, compared to dry etching, the inner surfaces of the recess portions formed through etching are coarsened. For this reason, it is possible to manufacture a light reception element in which the reflectance in the light shielding portion is further reduced.

Advantageous Effects of Invention

According to the aspect of the present invention, it is possible to provide a light reception element and a method for manufacturing a light reception element capable of reducing a reflectance in a light shielding portion.

BRIEF DESCRIPTION OF DRAWINGS

FIG. 4 is a view showing recess portions shown in FIG. 3.

FIG. 11 is photographs partially showing metal films of light reception elements according to an example and a modification example.

FIG. 14 is a view showing the metal film according to the modification example.

FIG. 16 is a plan view showing the metal film according to the modification example.

DESCRIPTION OF EMBODIMENT

Hereinafter, an embodiment according to an aspect of the present invention will be described in detail with reference to the drawings. In each of the diagrams, the same reference signs are applied to the same elements or corresponding elements, and duplicate description may be omitted.

Figure 1:
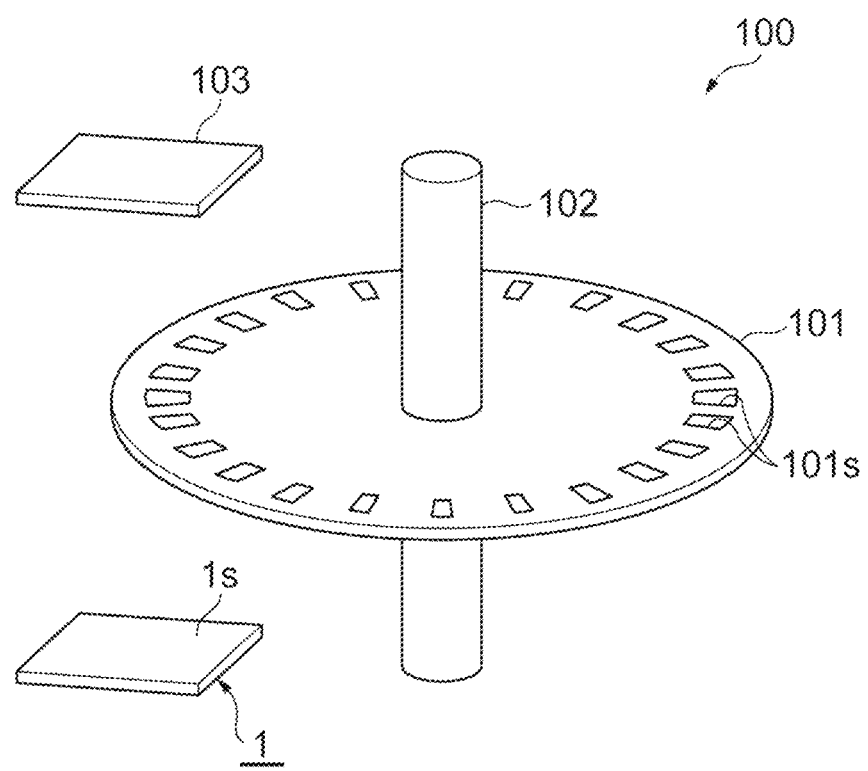
FIG. 1 is a schematic perspective view showing a rotary encoder according to an embodiment.

FIG. 1 is a schematic perspective view showing a rotary encoder according to the embodiment. As shown in FIG. 1, a rotary encoder 100 includes a code wheel 101, a rotary shaft 102, a light emitting element 103, and a light reception element 1. For example, the code wheel 101 is formed of glass, metal, or the like and has a disk shape. In an outer circumferential part of the code wheel 101, a plurality of slits 101s are formed in a circumferential direction. The rotary shaft 102 is provided at the center of the code wheel 101 and rotates the code wheel 101 in accordance with a rotation amount corresponding to operation of a drive unit (not shown in the diagram).

The light emitting element 103 and the light reception element 1 are disposed in a manner of facing each other such that the code wheel 101 is sandwiched therebetween. For example, the light emitting element 103 is a semiconductor light emitting element such as a light emitting diode or a laser diode. A fixing slit plate (not shown in the diagram) is interposed between the code wheel 101 and the light emitting element 103. For example, the light reception element 1 is a semiconductor light reception element such as a photodiode. Light receiving surfaces (a first surface 1s and a second surface 5s, which will be described below) of the light reception element 1 face a plate surface of the code wheel 101. The light reception element 1 is electrically connected to a computer (not shown in the diagram) or the like and outputs an electrical signal generated in response to incident light.

In the rotary encoder 100, light emitted from the light emitting element 103 is incident on the light reception element 1 through slits of the fixing slit plate and the slits 101s of the code wheel 101. At this time, a light amount of incident light changes periodically due to rotation of the code wheel 101. The light reception element 1 outputs electrical signals corresponding to the changes in light amount. When electrical signals output from the light reception element 1 are input to the computer or the like, the rotation amount of the code wheel 101 is detected.

As described above, the light receiving surfaces of the light reception element 1 and the plate surface of the code wheel 101 are disposed in a manner of being close to and facing each other. For this reason, there is concern that reflected light on the light receiving surface may be reflected by the plate surface of the code wheel 101 and may be incident on the light receiving surface again. As an idea for curbing this, an antireflection film is formed on the plate surface of the code wheel 101. However, in this case, the manufacturing cost of the code wheel 101 increases. Therefore, in order to resolve this problem, it is considered effective to reduce reflectances of the light receiving surfaces of the light reception element 1. In addition, the demand for reducing the reflectance of a light receiving surface is not limited to the case of using the light reception element 1 in the rotary encoder 100, and there is also similar demand in a configuration in which another member facing a light receiving surface is closely disposed or other configurations.

Figure 2:
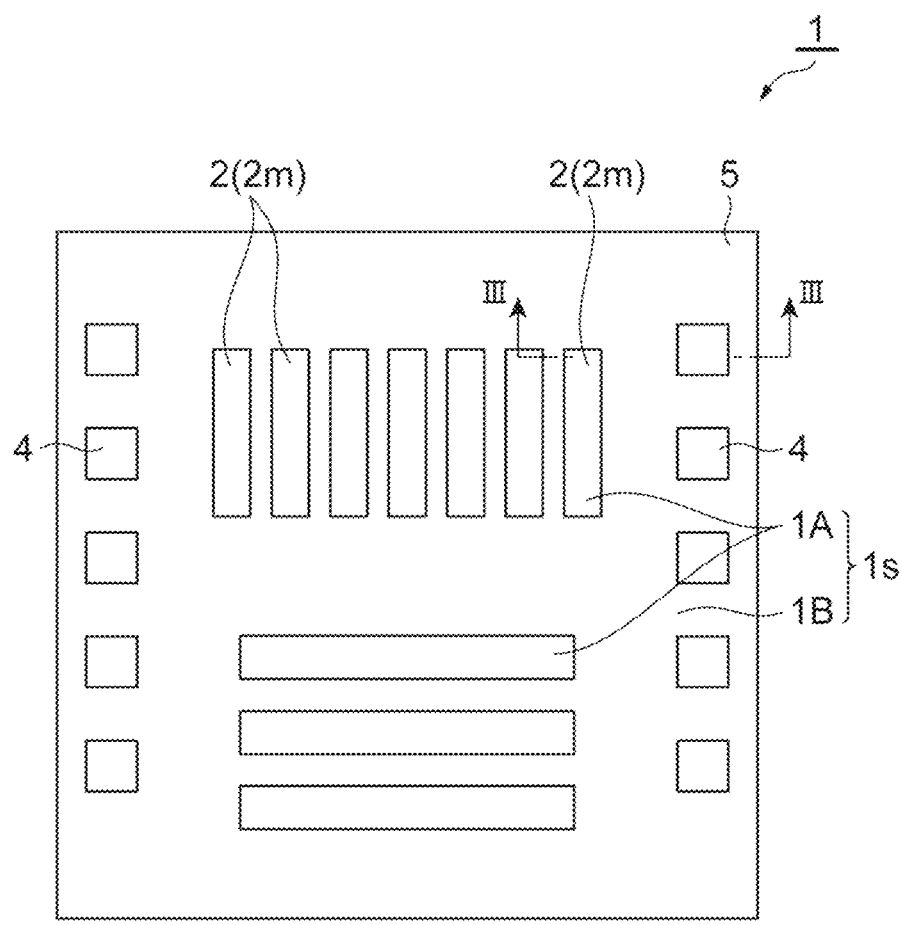
FIG. 2 is a plan view of a light reception element shown in FIG. 1.
Figure 3:
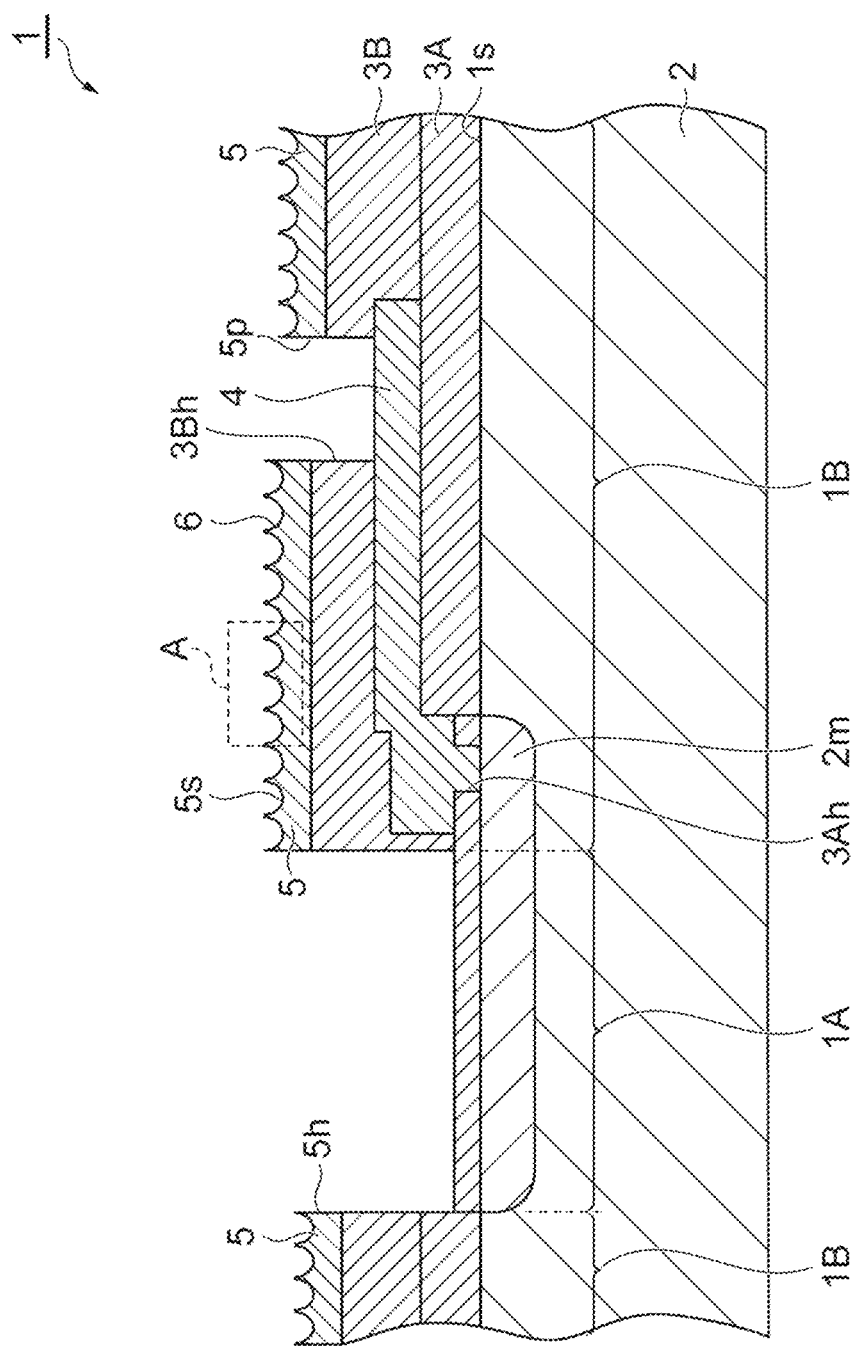
FIG. 3 is a partial cross-sectional view along line III-III in FIG. 2.

Subsequently, the light reception element 1 will be described. FIG. 2 is a plan view of the light reception element shown in FIG. 1. FIG. 3 is a partial cross-sectional view along line III-III in FIG. 2. As shown in FIGS. 2 and 3, the light reception element 1 includes semiconductor portions 2, insulating films 3A and 3B, a wiring layer 4, and a metal film 5. For example, the semiconductor portion 2 includes silicon (as an example, it is a silicon substrate). The semiconductor portion 2 includes the first surface 1s serving as a light receiving surface. Diffusion layers 2m are formed such that they are exposed on the first surface 1s in a region of a part of the first surface 1s on the semiconductor portion 2 side.

The first surface 1s includes a plurality of light receiving portions 1A and a single light shielding portion 1B. The light receiving portions 1A are provided in a manner of corresponding to the diffusion layers 2m. That is, the light receiving portions 1A serve as light incident portions with respect to a region in which incident light is converted into an electrical signal in the semiconductor portions 2. The light shielding portion 1B is shielded from light by the wiring layer 4 and/or the metal film 5. In other words, on the first surface 1s, an area covered with the wiring layer 4 and/or the metal film 5 is the light shielding portion 1B when viewed in a direction intersecting (orthogonal to) the first surface 1s, and areas exposed from the wiring layer 4 and/or the metal film 5 are the light receiving portions 1A. Here, the light receiving portions 1A are provided through openings 5h provided in the metal film 5.

The insulating film 3A is provided on the first surface 1s. The insulating film 3A is made of silicon oxide (for example, $SiO_2$), for example. The wiring layer 4 is provided on the insulating film 3A. The wiring layer 4 is made of aluminum, an aluminum alloy (for example, an alloy of aluminum and copper or silicon), tungsten, titanium, or titanium nitride, for example. Openings 3Ah (contact holes) are formed in the insulating film 3A, and the wiring layer 4 comes into contact with and is electrically connected to the semiconductor portions 2 (diffusion layers 2m) through these openings 3Ah.

The insulating film 3B is provided on the insulating film 3A and the wiring layer 4. The insulating film 3B is made of silicon oxide (for example, $SiO_2$), for example. Openings 3Bh are formed in the insulating film 3B, and the wiring layer 4 is exposed to the outside through these openings 3Bh. For example, parts of the wiring layer 4 exposed through the openings 3Bh are used as pad portions to which wires for taking out an electrical signal from the light reception element 1 are connected.

The metal film 5 is provided on the insulating films 3A and 3B and the wiring layer 4. That is, the metal film 5 is formed on the first surface is (light shielding portion 1B) through the insulating films 3A and 3B and the wiring layer 4. The metal film 5 comes into contact with only the insulating film 3B. For this reason, although the metal film 5 and the wiring layer 4 overlap each other when viewed in a direction intersecting the first surface is, the insulating film 3B is interposed therebetween, and the metal film 5 and the wiring layer 4 are electrically separated from each other. Meanwhile, openings 5p are formed in the metal film 5 at positions corresponding to the openings 3Bh. Therefore, the metal film 5 is not provided but the wiring layer 4 is disposed at positions corresponding to the openings 5p in the light shielding portion 1B. That is, in the light reception element 1, a metal of at least one of the metal film 5 and the wiring layer 4 is disposed on the light shielding portion 1B, and thus light shielding is achieved.

The metal film 5 is made of aluminum, an aluminum alloy (for example, an alloy of aluminum and copper or silicon), tungsten, titanium, or titanium nitride, for example. The metal film 5 may be constituted using the same steps and the same materials as those of the wiring layer 4, for example. The metal film 5 has the second surface 5s facing a side opposite to the first surfaces is of the semiconductor portions 2. The second surface 5s is exposed to the outside. Therefore, the second surface 5s also serves as a light receiving surface for receiving incident light. A plurality of recess portions 6 are formed on the second surface 5s. The recess portions 6 are formed throughout the entirety of the second surface 5s. Subsequently, this recess portions 6 will be described.

FIG. 4 is a view showing recess portions shown in FIG. 3. FIG. 4(a) is an enlarged plan view of a region A in FIG. 3, and FIGS. 4(b) and 4(c) are cross-sectional views showing a single recess portion. As shown in FIG. 4, here, the recess portions 6 have a circular shape when viewed in a direction intersecting (orthogonal to) the second surface 5s. A diameter D of the recess portion 6 (the maximum value for the size of the recess portion 6 in the second surface 5s) is within a range of 0.3 μm to 5 μm, for example. A thickness T of the metal film 5 (the size of the metal film 5 in a direction intersecting the second surface 5s) is within a range of approximately 0.1 μm to 5 μm, for example. The diameter D of the recess portion 6 does not depend on the thickness T of the metal film 5. For example, when the recess portions 6 are formed through wet etching, they can be formed arbitrarily by controlling the time necessary for wet etching such that the metal film 5 remains immediately below bottom parts 6b of the recess portions 6 and light shielding properties can be sufficiently maintained.

The recess portions 6 are arranged at a constant pitch P along the second surface 5s (in at least one direction). The pitch P is an interval between the centers of recess portions 6 adjacent to each other. Here, the recess portions 6 are arranged at the same pitch P in two directions (directions orthogonal to each other) along the second surface 5s. The pitch P is within a range of 0.6 μm to 20 μm, for example. Moreover, the pitch P is larger than the diameter D of the recess portion 6. Therefore, a flat region R, which is not a recess portion, is generated between recess portions 6 adjacent to each other at the pitch P. In other words, the second surface 5s includes the flat region R provided around the recess portions 6. In other words, on the second surface 5s, the recess portions 6 are not connected to each other and are separated from each other.

An inner surface 6s of the recess portion 6 has a curved portion 7. Here, the curved portion 7 extends from the second surface 5s to the bottom part 6b of the recess portion 6 and is curved such that the recess portion 6 reduces in size from the second surface 5s toward the bottom part 6b. The cross-sectional shape of the curved portion 7 is an arc shape, for example. As shown in FIG. 4(b), there are cases in which the inner surface 6s of the recess portion 6 includes the curved portion 7 extending from the second surface 5s and a flat part 8 positioned in the bottom part 6b. Alternatively, as shown in FIG. 4(c), the entirety of the inner surface 6s of the recess portion 6 may become the curved portion 7. In this case, the curved portion 7 extends to form the bottom part 6b of the recess portion 6. In this case, the diameter D of the recess portion 6 is equal to or smaller than the thickness T of the metal film 5.

Figure 5:
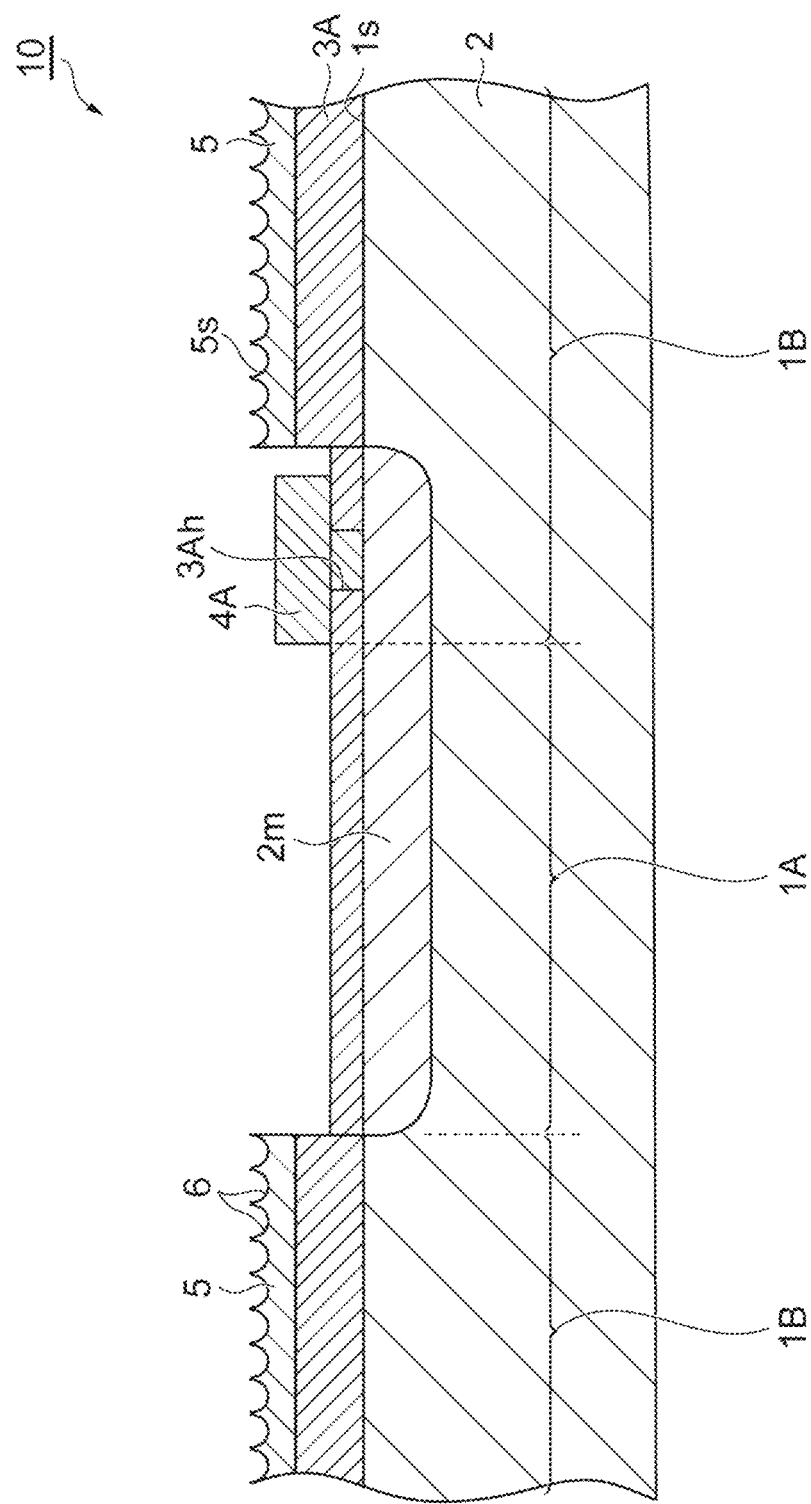
FIG. 5 is a partial cross-sectional view showing a light reception element obtained by simplifying the light reception element shown in FIG. 3.

Subsequently, a method for manufacturing a light reception element will be described. Here, in order to facilitate the description, a method for manufacturing a light reception element in which the configuration of the light reception element 1 is simplified will be described. FIG. 5 is a partial cross-sectional view showing a light reception element obtained by simplifying the light reception element shown in FIG. 3. As shown in FIG. 5, a light reception element 10 differs from the light reception element 1 in having no insulating film 3B and including a pad portion 4A in place of the wiring layer 4. Other elements of the light reception element 10 are the same as those of the light reception element 1.

Figure 6:
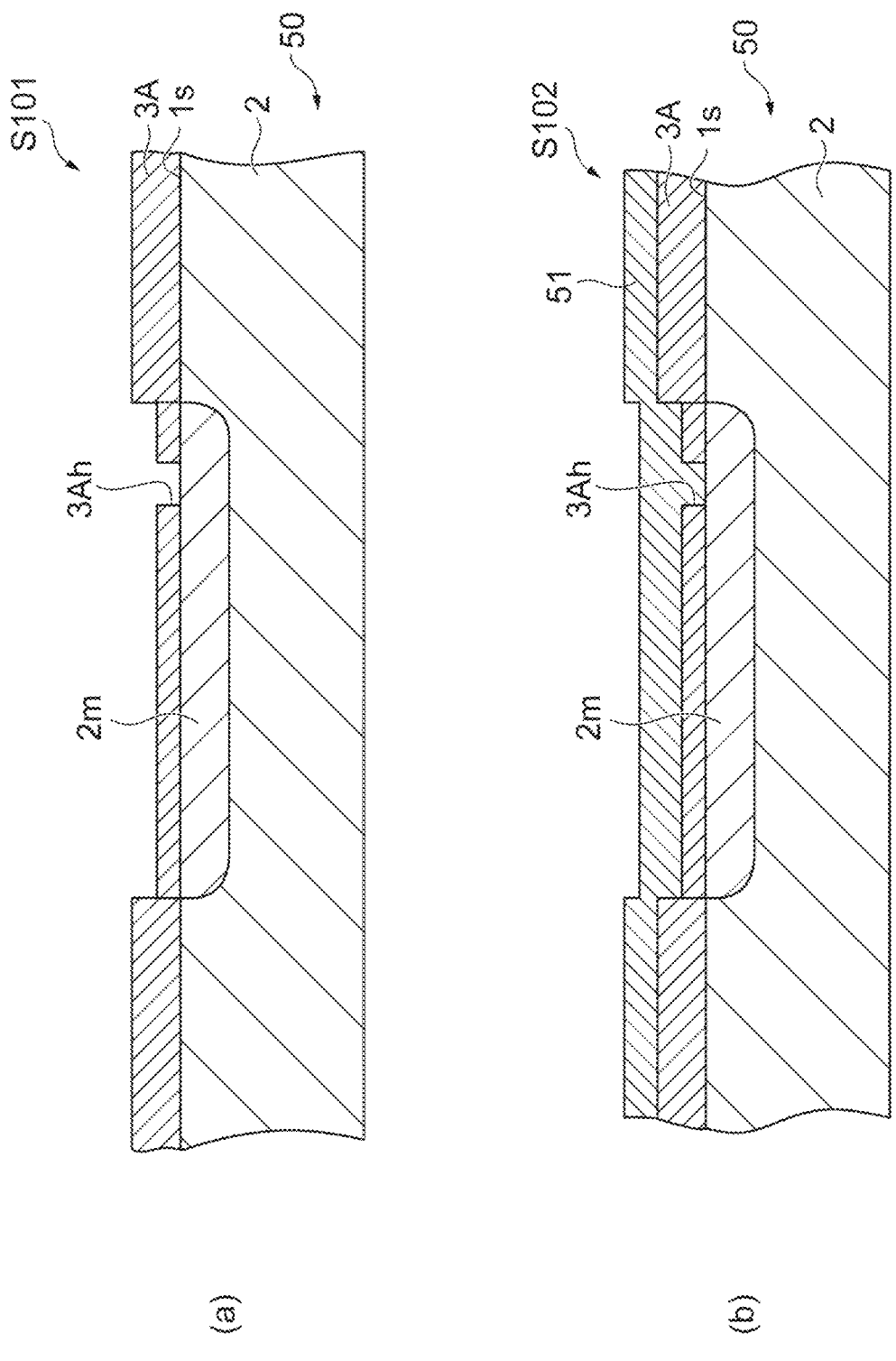
FIG. 6 is a partial cross-sectional view showing a main step of a method for manufacturing a light reception element shown in FIG. 5.
Figure 7:
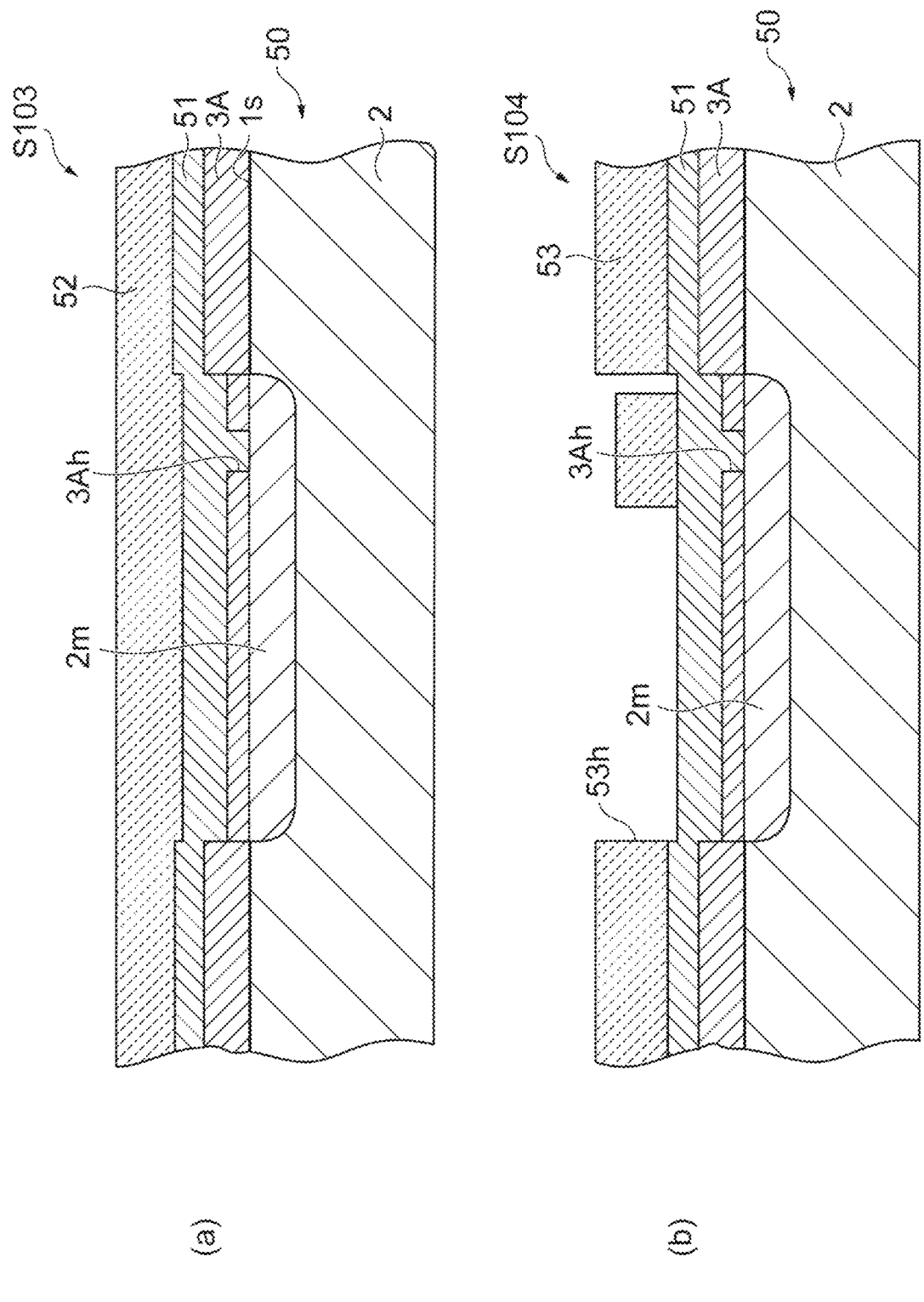
FIG. 7 is a partial cross-sectional view showing the main step of the method for manufacturing a light reception element shown in FIG. 5.

In this manufacturing method, first, as shown in FIG. 6(a), a base body 50 having the semiconductor portion 2 and the insulating film 3A with the openings 3Ah formed therein are prepared (Step S101). Subsequently, as shown in FIG. 6(b), a metal film 51 for the metal film 5 and the pad portion 4A is subjected to film formation on the insulating film 3A (Step S102, first step). Subsequently, as shown in FIG. 7(a), a resist 52 is applied to the metal film 51 (Step S103, first step). Subsequently, as shown in FIG. 7(b), patterning is performed through exposure and developing of the resist 52, and a mask 53 is formed (Step S104, first step). Openings 53h are formed in the mask 53 at positions corresponding to the light receiving portions 1A.

Figure 8:
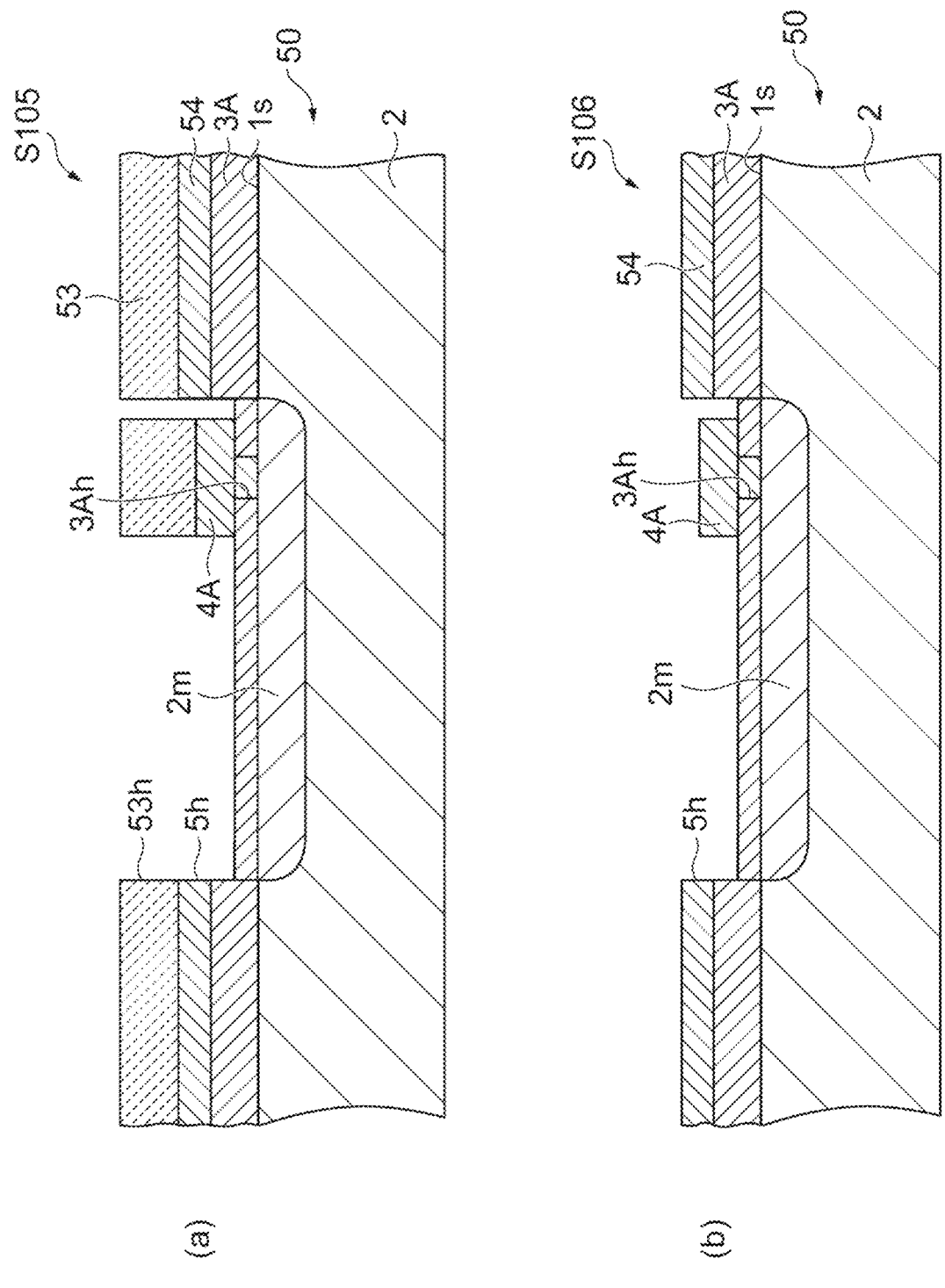
FIG. 8 is a partial cross-sectional view showing the main step of the method for manufacturing a light reception element shown in FIG. 5.

Subsequently, as shown in FIG. 8(a), the metal film 51 is etched using the mask 53 (Step S105, first step). Accordingly, parts exposed through the openings 53h of the metal film 51 are removed, and a metal film 54 and the pad portion 4A are formed. The metal film 54 is a part serving as the metal film 5 afterward. Further, as shown in FIG. 8(b), the mask 53 is removed (Step S106). Through Steps S101 to S106 described above, the light receiving portions 1A exposed from the metal film 54 and the light shielding portion 1B covered with the metal film 54 are formed on the first surfaces 1s by forming the light shielding metal film 54 for in a part on the first surfaces 1s of the semiconductor portions 2.

Figure 9:
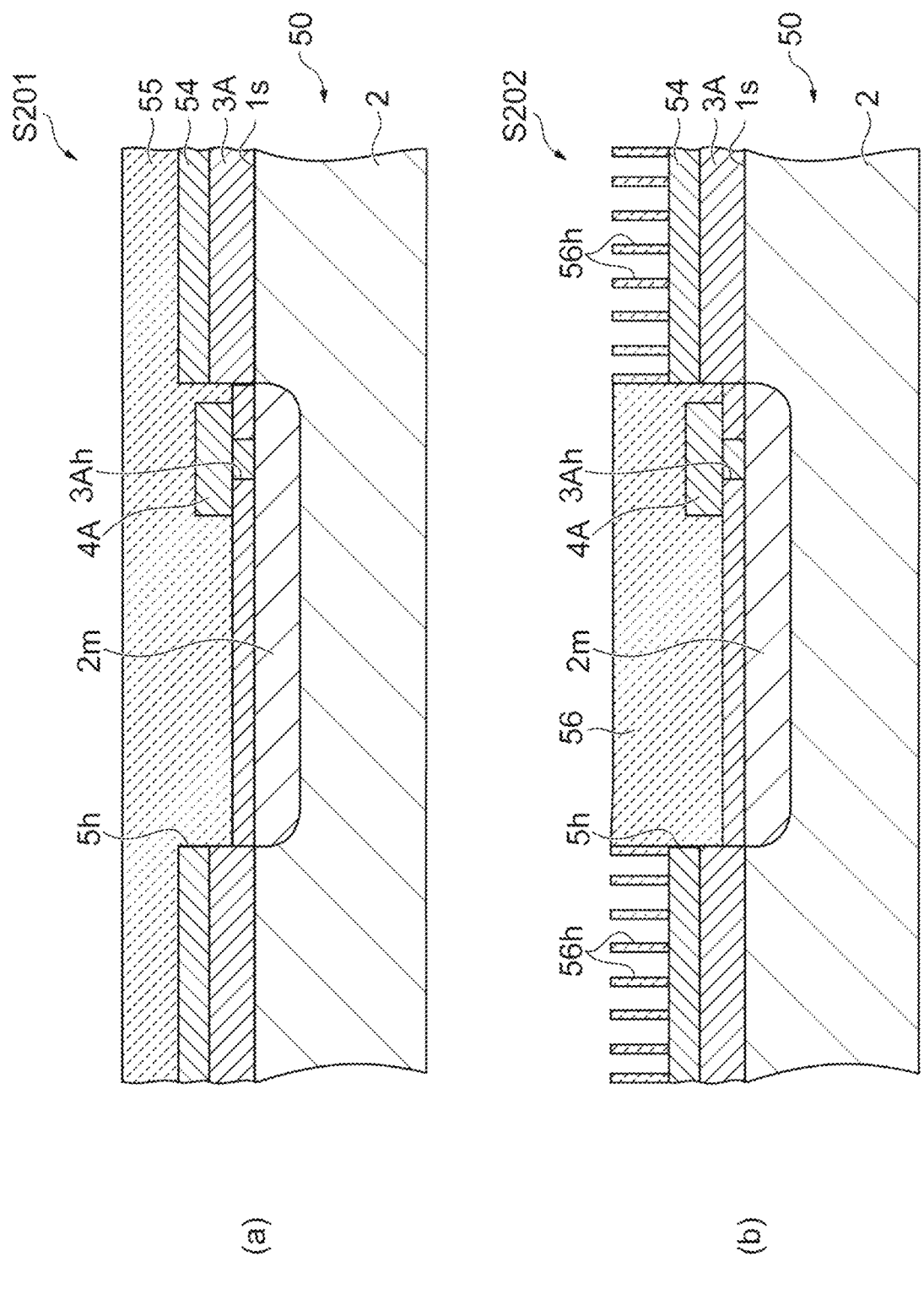
FIG. 9 is a partial cross-sectional view showing the main step of the method for manufacturing a light reception element shown in FIG. 5.

Subsequently, as shown in FIG. 9(a), a resist 55 is applied to parts on the metal film 54, the insulating film 3A, and the pad portion 4A (Step S201, second step). Subsequently, as shown in FIG. 9(b), patterning is performed through exposure and developing of the resist 55, and a mask 56 is formed (Step S202, second step). A plurality of openings 56h are formed in the mask 56 such that they correspond to the recess portions 6.

Figure 10:
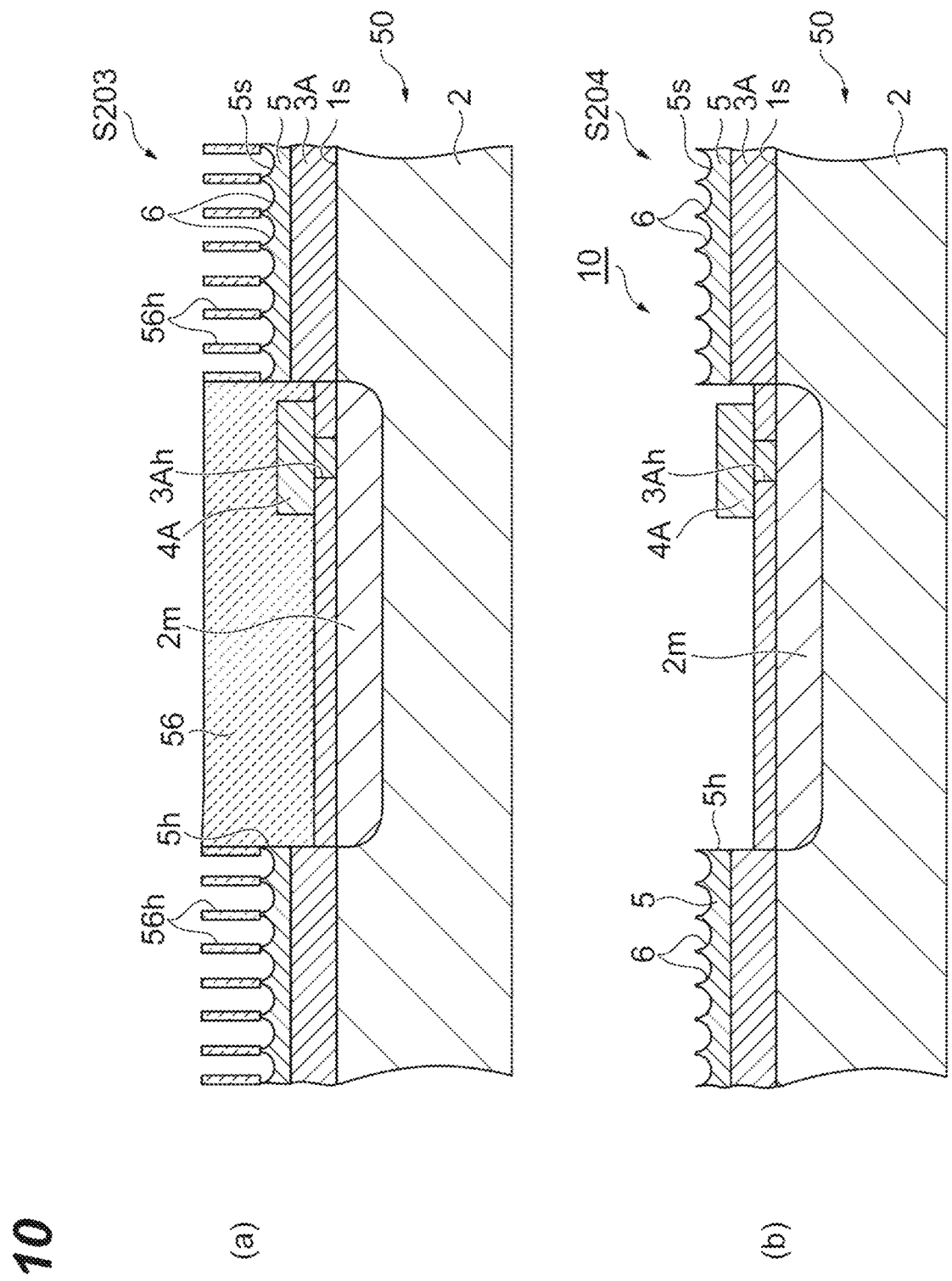
FIG. 10 is a partial cross-sectional view showing the main step of the method for manufacturing a light reception element shown in FIG. 5.

Subsequently, as shown in FIG. 10(a), a plurality of recess portions 6 are formed in the metal film 54 and the metal film 5 is formed by etching the metal film 54 using the mask 56 (Step S203, second step). Etching performed in this case is isotropic etching such as wet etching, for example. Here, the diameters D and the pitch P of the recess portions 6 can be controlled by controlling the sizes and the pitch of the openings 56h of the mask 56, the etching time in Step S203, and the like.

Further, as shown in FIG. 10(b), the mask 56 is removed (Step S204). Through Steps S201 to S204 described above, a plurality of recess portions 6 are formed on the second surface (second surface 5s) through isotropic etching on the second surface facing a side opposite to the first surface 1s in the metal film 54. Accordingly, the light reception element 10 is obtained.

As described above, in the light reception elements 1 and 10, the light shielding metal film 5 is formed on the light shielding portion 1B on the first surfaces 1s of the semiconductor portions 2. The metal film 5 has the second surface 5s facing a side opposite to the first surface 1s. A plurality of recess portions 6 are formed on the second surface 5s. Further, the inner surface 6s of the recess portion 6 includes the curved portion 7 curved such that the recess portion 6 reduces in size from the second surface 5s of the metal film 5 toward the bottom part 6b of the recess portion 6. For this reason, a part of light incident on the second surface 5s of the metal film 5 is reflected and diffused in various directions due to the curved portions 7 on the inner surfaces 6s of the recess portions 6. As a result, the reflectance in the light shielding portion 1B is reduced.

In addition, in the light reception elements 1 and 10, the diameter D of the recess portion 6 does not depend on the thickness T of the metal film 5. For example, when the recess portions 6 are formed through wet etching, they can be formed arbitrarily by controlling the time necessary for wet etching such that the metal film 5 remains immediately below the bottom parts 6b of the recess portions 6 and light shielding properties can be sufficiently maintained.

In addition, in the light reception elements 1 and 10, the curved portion 7 may extend such that the bottom part 6b is constituted. In this case, since the entirety of the inner surface 6s of the recess portion 6 becomes the curved portion 7, incident light can be reliably diffused.

In addition, in the light reception elements 1 and 10, the second surface 5s includes the flat region R provided around the recess portions 6. For this reason, the reflectance can be reliably reduced due to interference between light reflected by the flat region R on the second surface 5s and light reflected by the inner surfaces 6s of the recess portions 6.

Moreover, in the light reception elements 1 and 10, the recess portions 6 are arranged at the constant pitch P along the second surface 5s. For this reason, formation of the recess portions 6 can be facilitated.

Here, according to the manufacturing method described above, the light reception elements 1 and 10 including the semiconductor portions 2 having the first surfaces 1s including the light receiving portions 1A and the light shielding portion 1B, and the metal film 5 provided on the light shielding portion 1B and having a plurality of recess portions 6 formed therein are manufactured. Particularly, through isotropic etching on the second surface of the metal film 54, the inner surface 6s of the recess portion 6 can be formed to include the curved portion 7 curved such that the recess portion 6 reduces in size from the second surface 5s of the metal film 5 toward the bottom part 6b of the recess portion 6. Therefore, according to this manufacturing method, it is possible to manufacture the light reception elements 1 and 10 in which the reflectance in the light shielding portion 1B is reduced.

In addition, in the manufacturing method described above, isotropic etching is wet etching. For this reason, compared to dry etching, the inner surfaces 6s of the recess portions 6 formed through etching are coarsened. For this reason, it is possible to manufacture the light reception elements 1 and 10 in which the reflectance in the light shielding portion 1B is further reduced.

Subsequently, an example and a comparative example of the foregoing light reception element will be described. FIG. 11 is photographs partially showing metal films of light reception elements according to the example and the comparative example. FIG. 11(a) is a photograph of the second surface of the metal film of the light reception element according to the example. FIG. 11(b) is a photograph of the second surface of the metal film of the light reception element according to the comparative example. In the example shown in FIG. 11, the material of the metal film 5 was aluminum, the openings 56h of the mask 56 had a size of 0.8 μm, and etching (wet etching) was performed for 10 seconds. An etching agent was mixed acid including phosphoric acid. On the other hand, in the comparative example, while the material of the metal film and the sizes of the openings of the mask were the same as those of the example, dry etching was performed for 32 seconds. Here, an ECR method was adopted for anisotropic dry etching (however, an ICP method may be adopted for anisotropic dry etching).

As shown in FIG. 11(a), in the example, a plurality of recess portions 6 including curved portions curved such that they reduced in size from the second surface toward the bottom part were formed. In contrast, as shown in FIG. 11(b), in the comparative example, recess portions 6A having an inner surface extending in a flat manner in a direction from the second surface toward the bottom part were formed.

Figure 12:
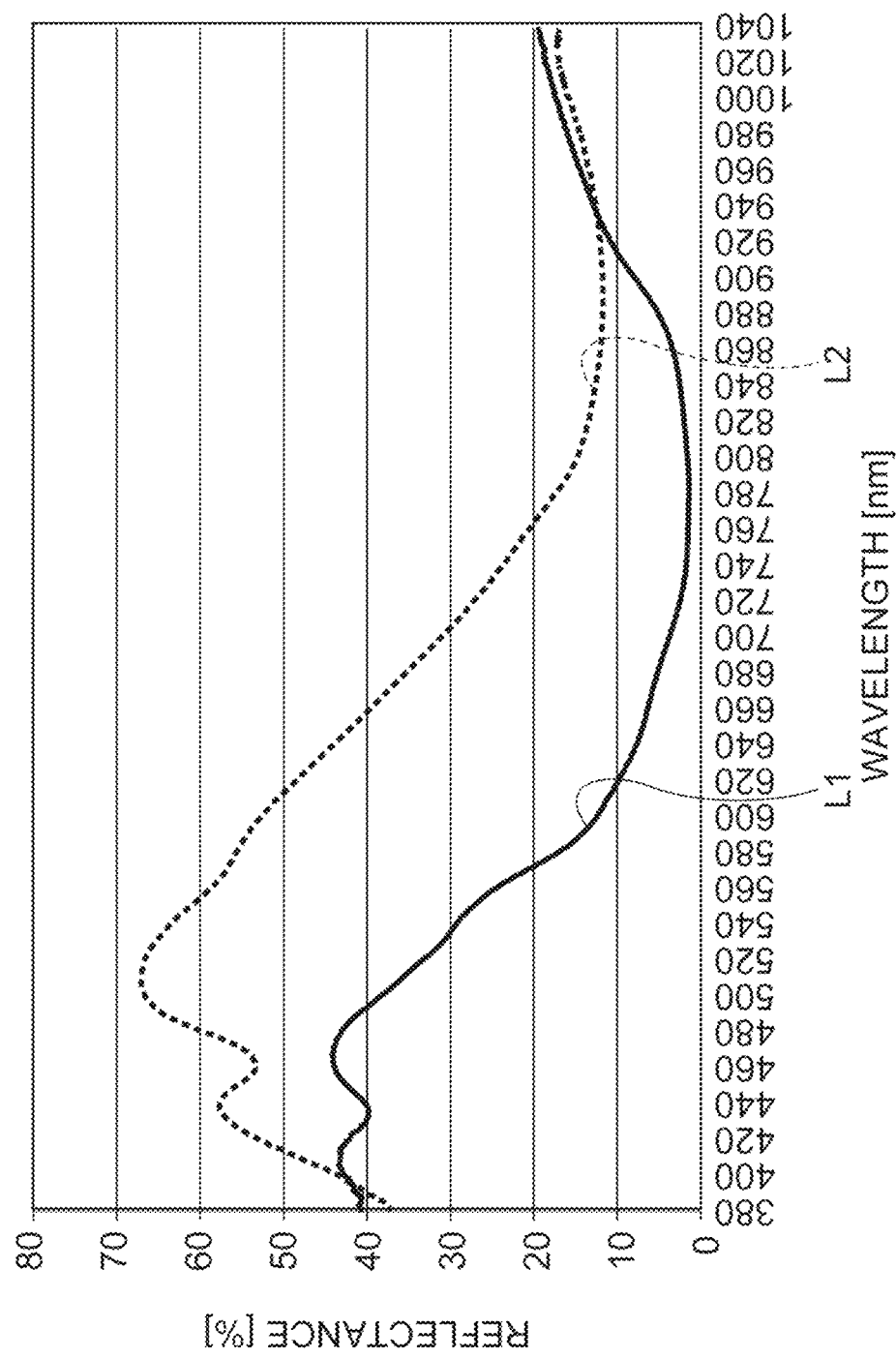
FIG. 12 is a graph showing reflectances of the light reception elements according to the example and a comparative example.

FIG. 12 is a graph showing reflectances of the light reception elements according to the example and the comparative example. In FIG. 12, a reflectance L1 of the light reception element (metal film) according to the example is indicated by the solid line, and a reflectance L2 of the light reception element (metal film) according to the comparative example is indicated by the dotted line. As shown in FIG. 12, the reflectance L1 according to the example falls below the reflectance L2 according to the comparative example substantially in the entire measurement range of a wavelength of 380 nm to a wavelength of 1,040 nm. Particularly, the reflectance L1 according to the example falls below 20% in a range of a wavelength of 580 nm to the wavelength of 1,040 nm, and it is confirmed that the reflectance is sufficiently reduced.

The foregoing embodiment is an embodiment describing the light reception element and the method for manufacturing a light reception element according to the aspect of the present invention. Therefore, the light reception element and the method for manufacturing a light reception element according to the aspect of the present invention are not limited to the foregoing embodiment and can be arbitrarily changed. Subsequently, a modification example will be described.

Figure 13:
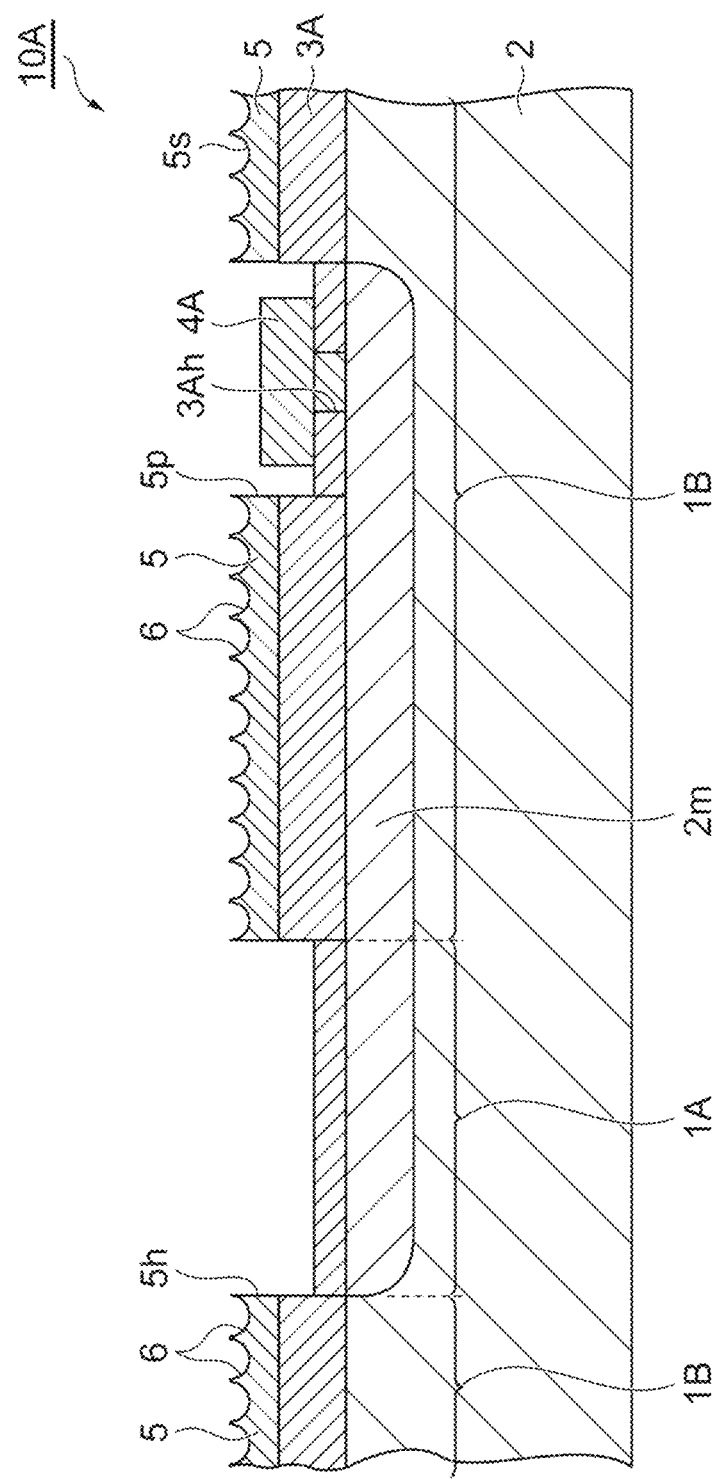
FIG. 13 is a partial cross-sectional view of the light reception element according to the modification example.

FIG. 13 is a partial cross-sectional view of the light reception element according to the modification example. For example, the light reception element 10 described above may be changed as shown in FIG. 13. In a light reception element 10A shown in FIG. 13, compared to the light reception element 10, the diffusion layer 2m is changed. In the light reception element 10A, the diffusion layer 2m extends beyond a region below the metal film 5 and the light shielding portion 1B from a region below the light receiving portion 1A. Further, the diffusion layer 2m comes into contact with and is electrically connected to the pad portion 4A at positions corresponding to the openings 5p of the metal film 5. In this manner, the diffusion layer 2m may be used as a wiring layer.

FIG. 14 is a view showing the metal film according to the modification example. In the metal film 5 shown in FIG. 14, the pitch P of the recess portions 6 substantially coincides with the diameter D of the recess portion 6. For this reason, the flat region R is not formed practically between recess portions 6 adjacent to each other at the pitch P. However, the flat region R is formed between recess portions 6 adjacent to each other at a pitch different from the pitch P (recess portions 6 adjacent to each other in a direction intersecting two arrangement directions at the pitch P). In this case, compared to the case shown in FIG. 4(a), the ratios of the area occupied by the recess portions 6 and the area occupied by the region R on the second surface 5s are different from each other. In this manner, in accordance with a desired form of reflection, the area ratio of the recess portions 6 and the region R can be suitably controlled.

Figure 15:
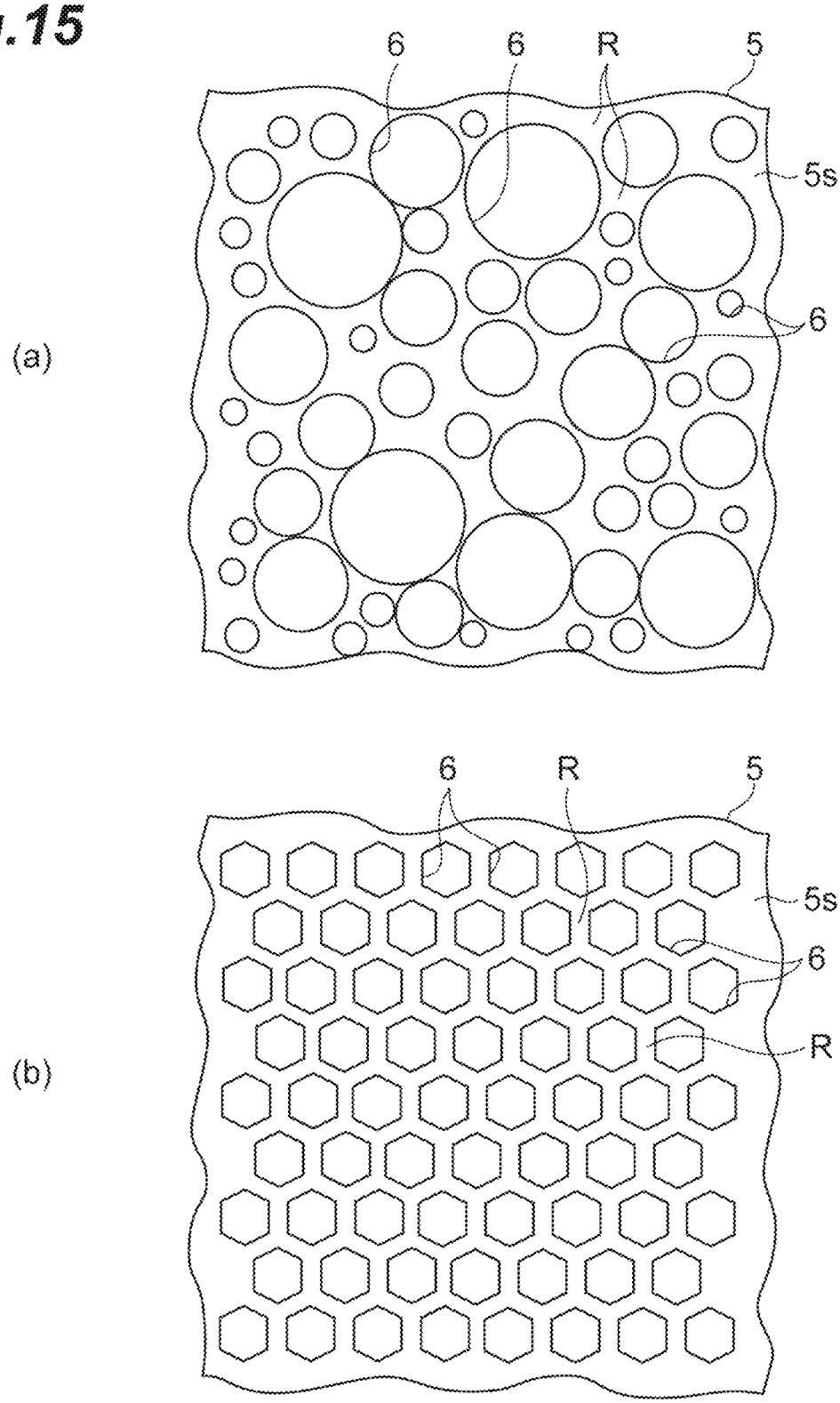
FIG. 15 is a plan view showing the metal film according to the modification example.

FIGS. 15 and 16 are plan views showing the metal film according to the modification example. As shown in FIG. 15(a), in the metal film 5, the pitch and the sizes of the recess portions 6 may be randomly set. Either the pitch or the sizes of the recess portions 6 may be randomly set. In addition, as shown in FIGS. 15(b) and 16(b), a plane shape of the recess portion 6 may be a shape other than a circular shape, such as a hexagonal shape or a square shape. Moreover, as shown in FIGS. 15(b) and 16(a), arrangement pitches of the recess portions 6 may be equivalent to each other in two directions intersecting each other at an angle of 45°, and the recess portions 6 may be arranged in a triangular lattice shape.

In addition, in the foregoing embodiment, wet etching has been described as an example of isotropic etching for forming the recess portions 6. However, for example, isotropic dry etching such as chemical dry etching can be utilized.

Moreover, in the foregoing embodiment, an example in which the light reception element 1 is used in a rotary encoder has been described. However, the light reception elements 1, 10, and 10A according to the present embodiment are not limited thereto and can be utilized in an arbitrary circumstance.

INDUSTRIAL APPLICABILITY

It is possible to provide a light reception element and a method for manufacturing a light reception element capable of reducing a reflectance in a light shielding portion.

REFERENCE SIGNS LIST 1, 10, 10A Light reception element
1s First surface
1A Light receiving portion
1B Light shielding portion
2 Semiconductor portion
5 Metal film
5s Second surface
6 Recess portion
6s Inner surface
6b Bottom part
7 Curved portion
R Region

The invention claimed is:

1. A light reception element comprising:
a semiconductor portion having a first surface including a light receiving portion and a light shielding portion; and
a metal film for light shielding provided on the light shielding portion,
wherein the metal film has a second surface facing a side opposite to the first surface and receiving incident light,
wherein a plurality of recess portions are formed on the second surface,
wherein an inner surface of the recess portion includes a curved portion curved such that the recess portion reduces in size in a direction along the second surface from the second surface toward a bottom part of the recess portion, and
wherein the second surface includes a flat region provided around the recess portions.

2. The light reception element according to claim 1,
wherein the curved portion extends so as to form the bottom part.

3. The light reception element according to claim 2,
wherein a size of the recess portion in the second surface is equal to or smaller than a size of the metal film in a direction intersecting the second surface.

4. The light reception element according to claim 1,
wherein the recess portions are arranged at a constant pitch along the second surface.

5. A method for manufacturing a light reception element comprising:
- a first step of forming a metal film for light shielding on a part of a first surface of a semiconductor portion to form a light receiving portion exposed from the metal film and a light shielding portion covered with the metal film on a first surface; and
- a second step of performing isotropic etching on a second surface of the metal film facing a side opposite to the first surface to form a plurality of recess portions on a second surface by performing isotropic etching on the second surface of the metal film facing a side opposite to the first surface.

6. The method for manufacturing a light reception element according to claim 5,
wherein the isotropic etching is wet etching.

* * * * *